United States Patent
Levinson

(10) Patent No.: US 9,093,481 B2
(45) Date of Patent: Jul. 28, 2015

(54) METHOD FOR SEMICONDUCTOR WAFER FABRICATION UTILIZING A CLEANING SUBSTRATE

(75) Inventor: Harry J. Levinson, Saratoga, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 606 days.

(21) Appl. No.: 11/789,157

(22) Filed: Apr. 23, 2007

(65) Prior Publication Data

US 2008/0257383 A1 Oct. 23, 2008

(51) Int. Cl.
*H01L 21/02* (2006.01)
*H01L 21/67* (2006.01)
*G03F 7/20* (2006.01)

(52) U.S. Cl.
CPC ...... *H01L 21/67028* (2013.01); *G03F 7/70925* (2013.01); *H01L 21/02057* (2013.01); *H01L 21/67011* (2013.01)

(58) Field of Classification Search
USPC ........................................................ 134/6, 42
See application file for complete search history.

(56) References Cited

U.S. PATENT DOCUMENTS

| | | | | |
|---|---|---|---|---|
| 3,575,179 A * | 4/1971 | Troll et al. | ..................... | 131/333 |
| 5,671,119 A * | 9/1997 | Huang et al. | .................. | 361/234 |
| 5,690,749 A * | 11/1997 | Lee | .................................. | 134/6 |
| 6,013,236 A * | 1/2000 | Takahashi et al. | ............ | 423/345 |
| 6,821,620 B2 * | 11/2004 | Namikawa et al. | ..... | 428/355 AC |
| 7,004,180 B2 * | 2/2006 | Akiba | .......................... | 134/22.1 |
| 2002/0024883 A1 * | 2/2002 | Odashima et al. | ............ | 365/233 |
| 2002/0153024 A1 * | 10/2002 | Akiba | ............................ | 134/1.1 |
| 2005/0101251 A1 * | 5/2005 | Kondo et al. | ................ | 455/41.2 |
| 2005/0191499 A1 * | 9/2005 | Liu et al. | ....................... | 428/421 |
| 2006/0008660 A1 * | 1/2006 | Parkhe | .......................... | 428/446 |

* cited by examiner

*Primary Examiner* — Nicole Blan
(74) *Attorney, Agent, or Firm* — Farjami & Farjami LLP

(57) ABSTRACT

In one disclosed embodiment, the present method for semiconductor fabrication utilizing a cleaning substrate comprises loading a cleaning substrate capable of removing an undesirable particle from a semiconductor processing tool onto the tool, causing the undesirable particle to be attracted to the cleaning substrate, and unloading the cleaning substrate from the semiconductor processing tool. Following cleaning, the processing tool can be used for producing a lithographic pattern on a semiconductor wafer. In one embodiment, the cleaning substrate comprises an electret. In another embodiment, the cleaning substrate comprises an adhesive layer. The present method can be used without breaking vacuum, or otherwise altering the operational state of a processing tool. In one embodiment, the present method is used in conjunction with an exposure tool utilized for high resolution lithography, for example, an extreme ultraviolet (EUV) lithographic exposure tool.

13 Claims, 9 Drawing Sheets

METHOD FOR SEMICONDUCTOR WAFER FABRICATION UTILIZING A CLEANING SUBSTRATE

TECHNICAL FIELD

The present invention is generally in the field of semiconductor devices. More particularly, the invention is in the field of fabrication of semiconductor wafers.

BACKGROUND ART

During semiconductor wafer fabrication, very small lithographic patterns, such as nanometer-scale lithographic patterns, can be transferred from a lithographic mask to a semiconductor wafer. In a high resolution fabrication process, for example, extreme ultraviolet (EUV) lithography, fabrication elements such as semiconductor wafers and lithographic masks may by supported on the surfaces of chucks, as they are cycled through a number of processing tools. Some of those processing tools may require a vacuum environment for performance of their precision processing steps. Through repeated use, debris comprising undesirable particles can accumulate on the surface of the chucks, causing the fabrication elements supported by them to be misaligned during a processing step, thereby resulting in fabrication involving those elements to fail.

A conventional approach to remedying the accumulation of undesirable particles on the chuck surfaces is to periodically clean those surfaces, in order to rid them of the offending debris. Typically, this is a manual process, requiring access to the interior portion of a processing tool under ambient environmental conditions. For processing tools requiring a vacuum environment for their operation, periodic cleaning involves time lost to re-establishment of vacuum conditions after cleaning is completed, in addition to the time consumed by the cleaning process itself. In many cases, the time required to restore the vacuum environment required for processing is the major factor in determining the downtime of a processing tool.

As semiconductor fabrication moves towards formation of ever finer patterns and higher resolutions, vulnerability of the entire fabrication process to irregularities in pattern transfer becomes increasingly acute, and the need for more frequent cleaning of support surfaces correspondingly great. Thus, in the context of present approaches to avoiding accumulation of undesirable particles on processing surfaces, improvements in resolution come at the cost of reduced processing efficiency.

SUMMARY

A method for semiconductor wafer fabrication utilizing a cleaning substrate, substantially as shown in and/or described in connection with at least one of the figures, as set forth more completely in the claims.

DETAILED DESCRIPTION OF THE INVENTION

The present invention is directed to a method for semiconductor wafer fabrication utilizing a cleaning substrate. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1A:
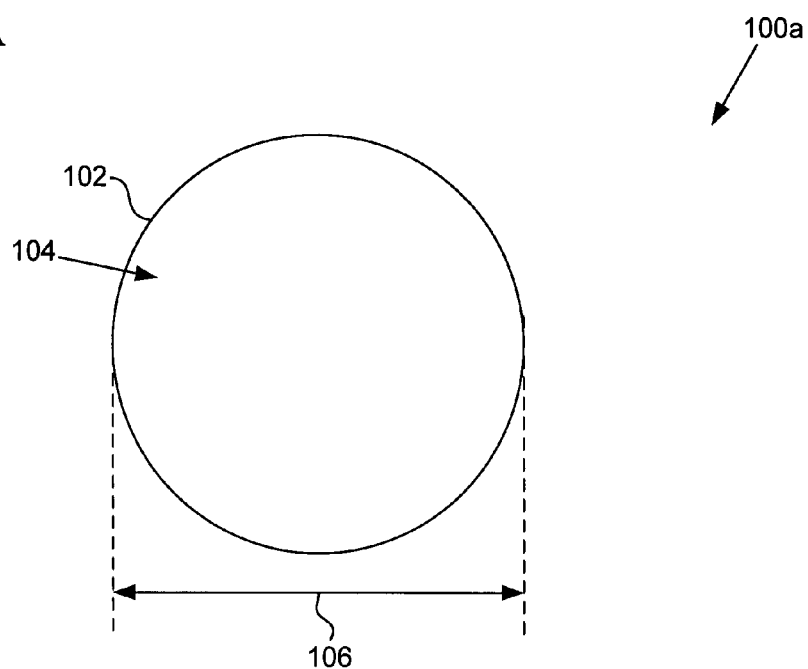
FIGS. 1A and 1B show bottom and cross-sectional views of a fabrication element, depicting a problem resolved by an embodiment of the present invention.
Figure 1B:
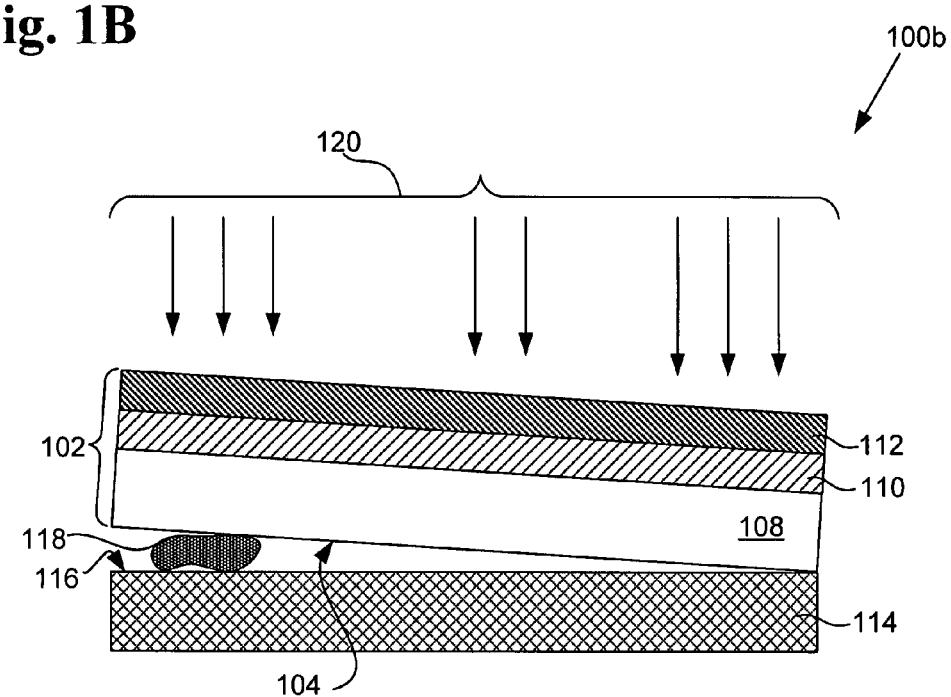

FIGS. 1A and 1B show bottom and cross-sectional views of a fabrication element, depicting a problem resolved by an embodiment of the present invention. Structure 100a in FIG. 1A shows a bottom view of fabrication element 102, having bottom surface 104 and diameter 106. In the present exemplary structure, fabrication element 102 corresponds to a semiconductor wafer prepared for lithographic patterning. It should be noted, however, that this representation is exemplary only, and fabrication element 102 may assume other shapes and correspond to other structures as well. For example, in one embodiment, fabrication element 102 can be square rather than round, and correspond to a lithographic mask rather than a semiconductor wafer.

Structure 100b, appearing in FIG. 1B, shows a cross-sectional view of fabrication element 102 prepared for lithographic patterning, for example, in a high resolution extreme ultraviolet (EUV) or electron beam lithographic process. In FIG. 1B, structure 100b shows fabrication element 102 undergoing a lithographic processing step. Structure 100b includes fabrication element 102 having bottom surface 104, corresponding to fabrication element 102 having bottom surface 104 in structure 100a. In the present exemplary structure, fabrication element 102 includes semiconductor wafer 108, material layer 110, and blanket resist 112. Also present in structure 100b are chuck 114 having top surface 116, undesirable particle 118, and patterned radiation 120.

FIG. 1B illustrates a problem which may occur during semiconductor fabrication, and which may be resolved by the present invention. Undesirable particle 118, residing on top surface 116 of chuck 114, prevents bottom surface 104 of semiconductor wafer 108 from resting evenly on top surface 116 of chuck 114 during processing. In the processing step shown by structure 100b in FIG. 1, semiconductor wafer 108 is being exposed to patterned radiation 120, for example, in a deep ultraviolet (DUV) or EUV lithographic exposure tool. As a result of the presence of undesirable particle 118, semiconductor wafer 108 is defocused during exposure to patterned radiation 120. Overlay errors may also result from the presence of undesirable particles between the substrate and the chuck. The resulting defocus or overlay error may in turn cause the processing step shown in structure 100b to fail.

Figure 2A:
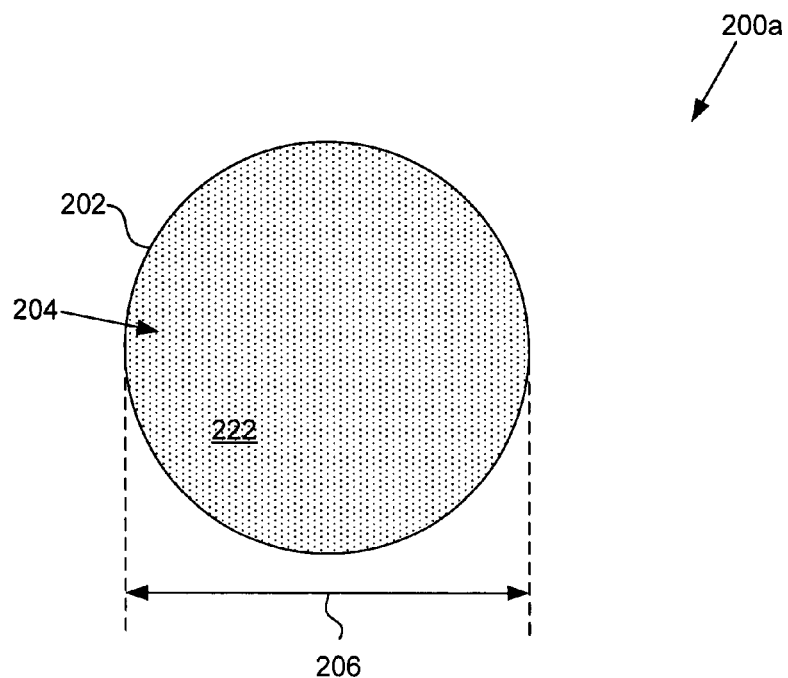
FIGS. 2A and 2B show bottom and cross-sectional views of an exemplary structure, according to one embodiment of the present invention.
Figure 2B:
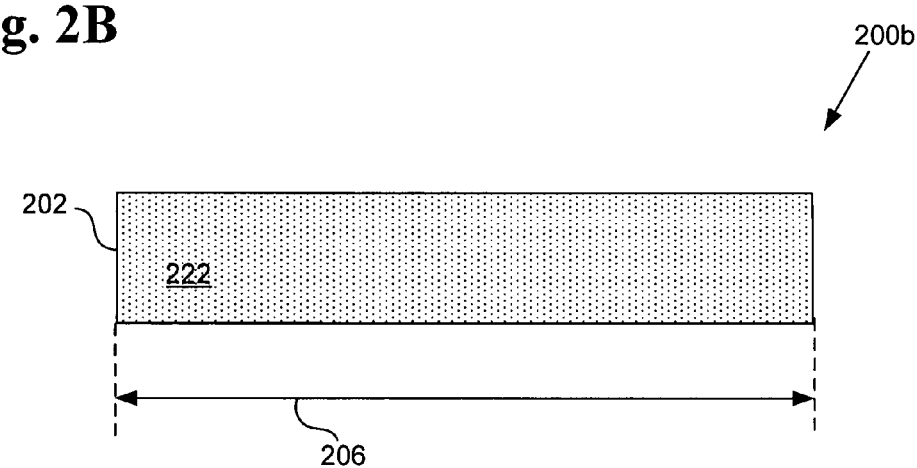

Turning to FIGS. 2A and 2B, structure 200a of FIG. 2A shows a bottom view of cleaning substrate 202 comprising electret 222, having bottom surface 204 and diameter 206, according to one embodiment of the present invention. Structure 200b in FIG. 2B shows a cross-sectional view of cleaning substrate 202 comprising electret 222 and diameter 206. Electret 222 possesses a quasi-permanent electric field, and may comprise a naturally occurring substance, for example, quartz or silicon dioxide, or a synthetic substance, for example, polypropylene or polyethylene terephthalate.

In the embodiment shown in FIGS. 2A and 2B, cleaning substrate 202 is formed so as approximately to replicate the dimensions of a corresponding fabrication element, in this instance, fabrication element 102 comprising semiconductor wafer 108, material layer 110, and blanket resist 112 of FIG. 1B. In other words, in the present exemplary situation, cleaning substrate 202 in FIGS. 2A and 2B corresponds to fabrication element 102 in FIGS. 1A and 1B. Where, as here, fabrication element 102 comprises semiconductor wafer 108 having diameter 106, cleaning substrate 202 is formed to have diameter 206 approximately replicating a typical diameter of a semiconductor wafer, for example, approximately 300 millimeters.

Figure 2C:
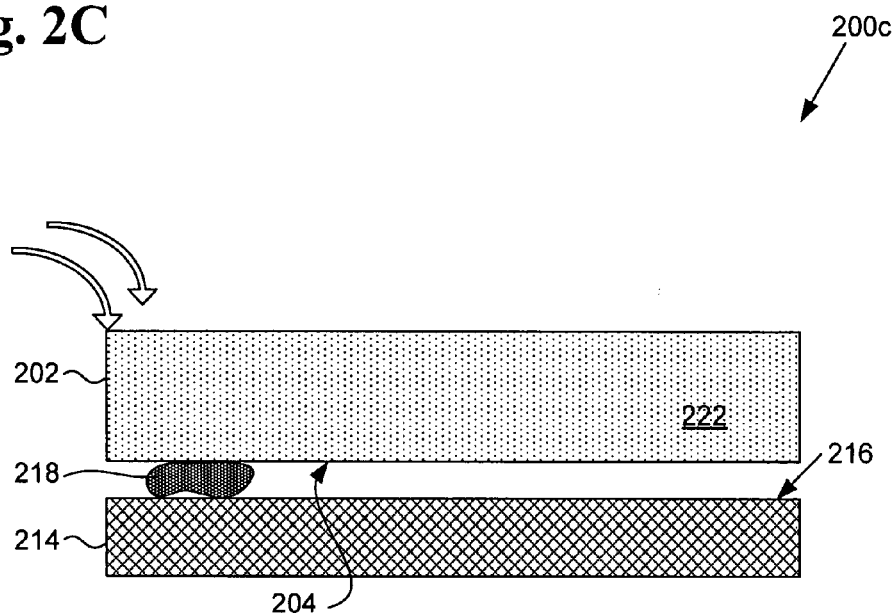
FIGS. 2C and 2D show exemplary structures corresponding to initial and intermediate steps in the flowchart of FIG. 5, according to an embodiment of the present invention.

Referring now to FIG. 2C, structure 200c includes cleaning substrate 202 having bottom surface 204, chuck 214 having top surface 216, and undesirable particle 218, corresponding respectively to fabrication element 102 having bottom surface 104, chuck 114 having top surface 116, and undesirable particle 118 in structure 100b of FIG. 1B. As can be seen from FIG. 2C, cleaning substrate 202 comprising electret 222 is loaded onto top surface 216 of chuck 214, on which resides undesirable particle 218.

Figure 2D:
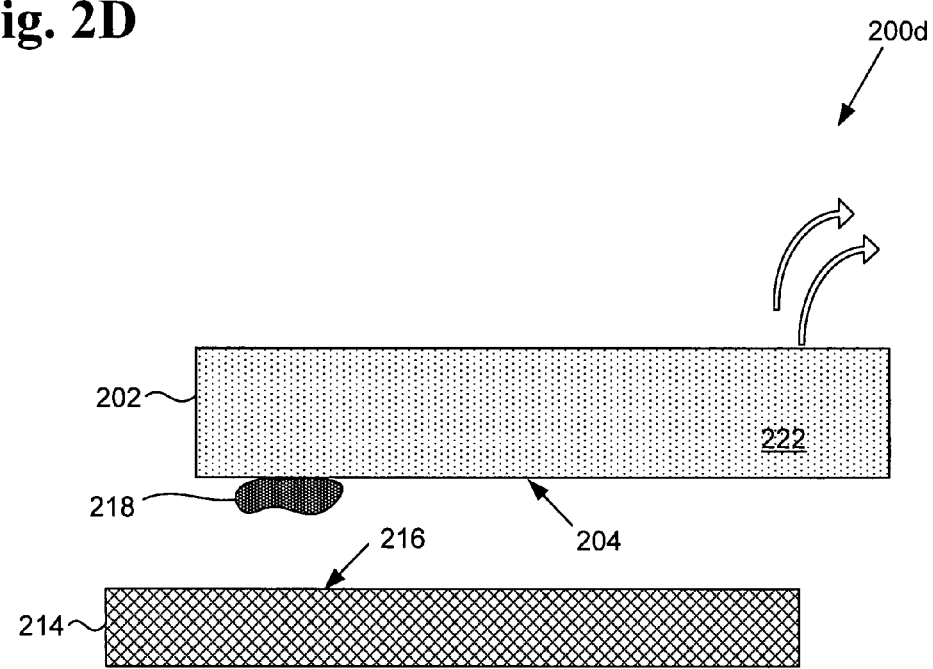

FIG. 2C and following FIG. 2D show how the present invention can be implemented to remove an undesirable particle from a semiconductor processing tool, according to the exemplary embodiment shown in FIGS. 2A and 2B. In FIG. 2C, cleaning substrate 202 comprising electret 222 is loaded onto chuck 214 bearing undesirable particle 218. In that process, cleaning substrate 202 causes undesirable particle 218 to be attracted to bottom surface 204. When cleaning substrate 202 is unloaded from chuck 214 in a subsequent step, shown in FIG. 2D, the attraction between cleaning substrate 202 and undesirable particle 218 causes undesirable particle 218 to attach to bottom surface 204 and be removed from top surface 216 of chuck 214. Through the process described, the processing tool utilizing chuck 214 to support fabrication elements corresponding to cleaning substrate 202, for example, a lithographic mask or a semiconductor wafer, is cleaned, thereby preventing the processing errors shown in FIG. 1B.

According to the present embodiment, cleaning substrate 202 causes undesirable particle 218 to be attracted to bottom surface 204, because cleaning substrate 202 comprises electret 222. An electret is a material possessed of a quasi-permanent electric field. The proximity of that field can induce an electric dipole moment in an otherwise electrically neutral particle, such as undesirable particle 218, so as to produce an attractive force between the field and the particle. Because the field inducing an electric dipole moment is produced within the electret comprised by cleaning substrate 202, physical transfer of substrate 202 away from chuck 214 in an unloading step attracts undesirable particle off of top surface 216 of chuck 214, and out of the processing tool containing chuck 214.

Although the foregoing discussion of the mechanism involved in removal of undesirable element 218 from chuck 214 by cleaning substrate 202 has concerned the ability of electret 222 to attract a neutral particle, it should be evident that electret 222 will also attract a particle having net charge opposite the charge of an electric pole at bottom surface 204. Thus, if the polarity of electret 222 is such that bottom surface 204 is a negative pole, cleaning substrate 202 would attract both neutral particles and positively charged particles from chuck 214. In another embodiment, cleaning substrates, such as cleaning substrate 202 can be implemented in tandem, so that cleaning substrates of opposite polarity are successively loaded and unloaded from a processing tool. In that way substantially all undesirable particles may be removed by use of the present invention.

A significant advantage of the present invention over conventional approaches to removing undesirable particles from semiconductor processing tools, is that the present invention may be used by simply loading cleaning substrate 202 into the processing tool, cycling the tool through a mechanical cycle (physical transfer only, without operation of plasmas, emission of lithographic radiation, use of solvents, etc.) and unloading cleaning substrate 202 from the tool, all while the tool remains in an operational state. Thus, a tool requiring a vacuum environment for performance of its processing step could be cleaned by implementation of the present embodiment, without breaking vacuum. By cycling the tool through a mechanical cycle rather than a full operational cycle, valuable processing resources may be conserved and cleaning substrates preserved for reuse after their own subsequent cleansing, which may be performed outside of the processing tool in which they are utilized.

In contrast to the present invention's method, conventional approaches typically involve deactivating a processing tool, performing a manual cleaning process under ambient conditions, and reactivating the processing tool. Reactivation of a processing tool to bring it into an operational state, for example, re-establishment of a vacuum for a lithographic exposure tool, may involve a significant amount of the total time required for cleaning in the conventional approach, whereas that component of the total time dedicated to the cleaning process is substantially eliminated by the present invention's method. Moreover, the present method automates the cleaning process, reducing the time and cost required for active cleaning, which is typically performed manually in conventional techniques.

Figure 3A:
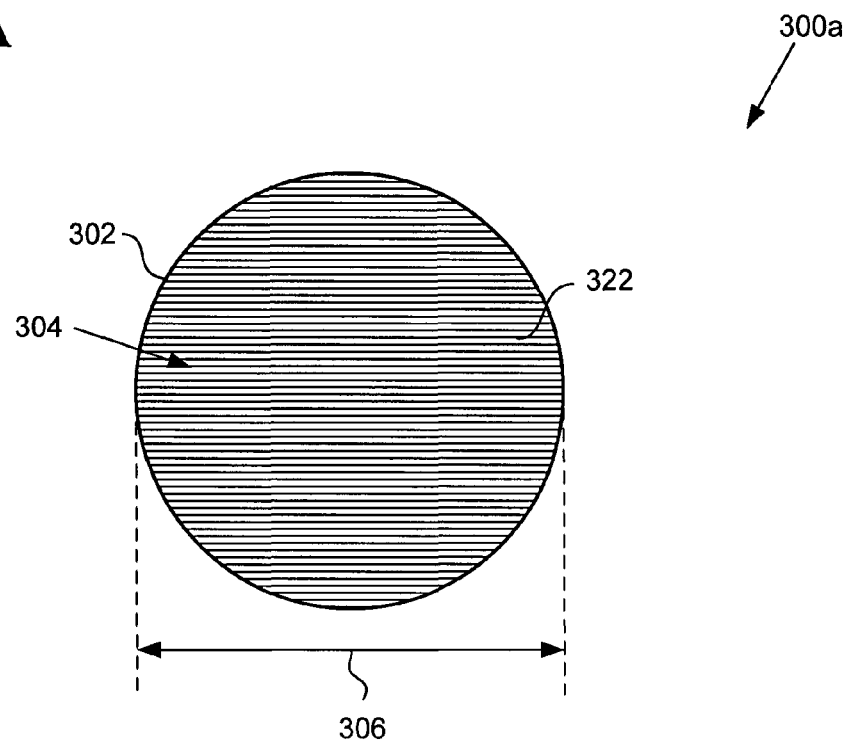
FIGS. 3A and 3B show bottom and cross-sectional views of an exemplary structure, according to another embodiment of the present invention.
Figure 3B:
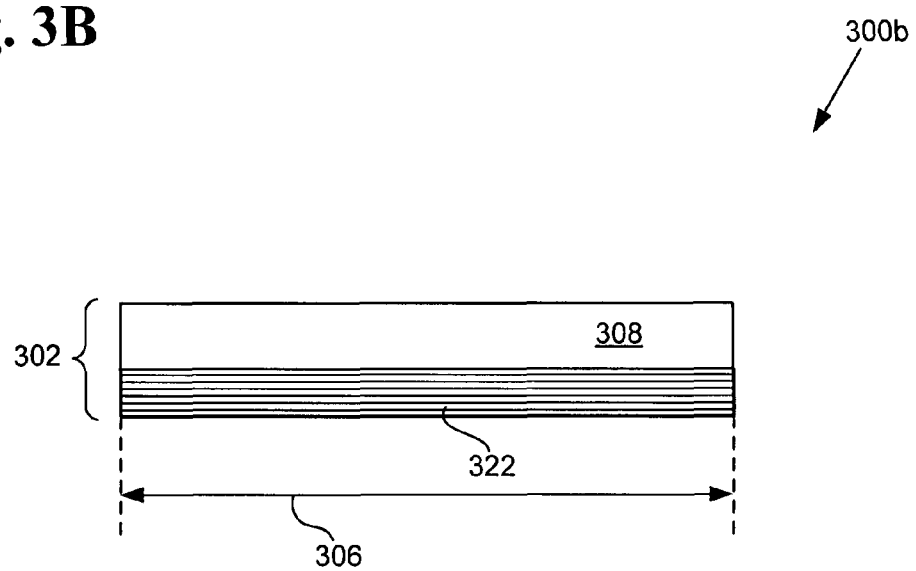

Turning now to FIGS. 3A and 3B, structure 300a of FIG. 3A shows a bottom view of cleaning substrate 302 comprising electret layer 322, having bottom surface 304 and diameter 306, according to one embodiment of the present invention, and corresponding respectively to cleaning substrate 202 comprising electret 222, having bottom surface 204 and diameter 206, in the embodiment of FIG. 2A. Structure 300b in FIG. 3B shows a cross-sectional view of cleaning substrate 302 comprising electret layer 322 and diameter 306, corresponding to cleaning substrate 202 comprising electret 222, and diameter 206 in FIG. 2B. Also shown in FIG. 3B is structural layer 308, which is also comprised by cleaning substrate 302, and situated above electret layer 322, but is absent from the embodiment in FIG. 2B.

The embodiment shown in FIGS. 3A and 3B is entirely analogous to the embodiment shown in FIGS. 2A and 2B. Differences between the two embodiments include presence of structural layer 308 as a constituent of cleaning substrate 302, and presence of electret layer 322 as a separate layer of cleaning substrate 302. Structural layer 308 may be included in cleaning substrate 302 to provide structural support to an electret lacking material rigidity, or an electret comprising a costly or rare material, for example. Structural layer 308 permits cleaning substrate 302 to assume the dimensions of a desired fabrication element for which it would be substituted during a cleaning process, and may comprise any suitable substrate, for example, a layer of silicon or a metal layer. Thus, presence of structural layer 308 permits formation of cleaning substrate 302 without limitation imposed by the cost, scarcity, or lack of mechanical rigidity of electret layer 322.

Figure 3C:
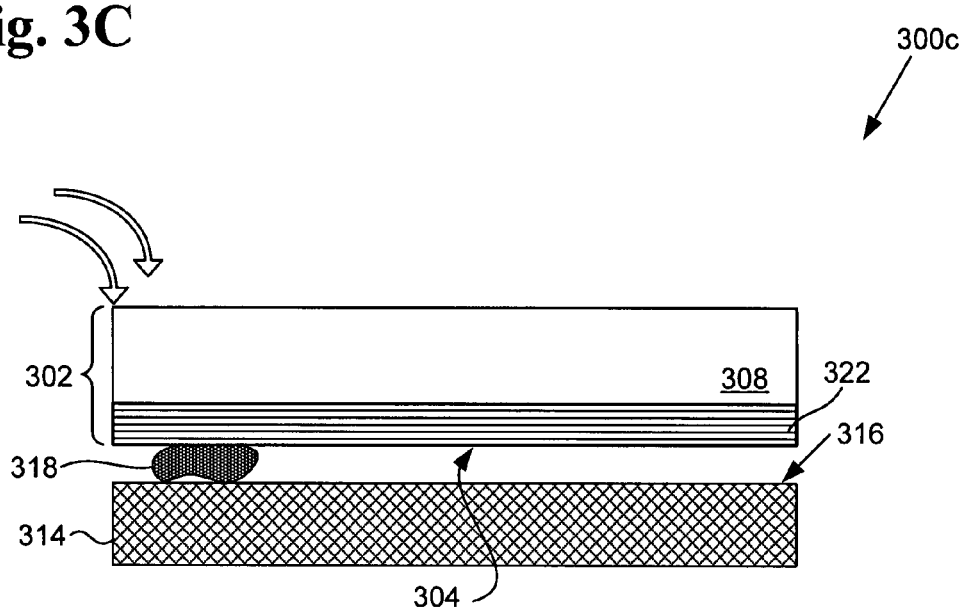
FIGS. 3C and 3D show exemplary structures corresponding to initial and intermediate steps in the flowchart of FIG. 5, according to an embodiment of the present invention.
Figure 3D:
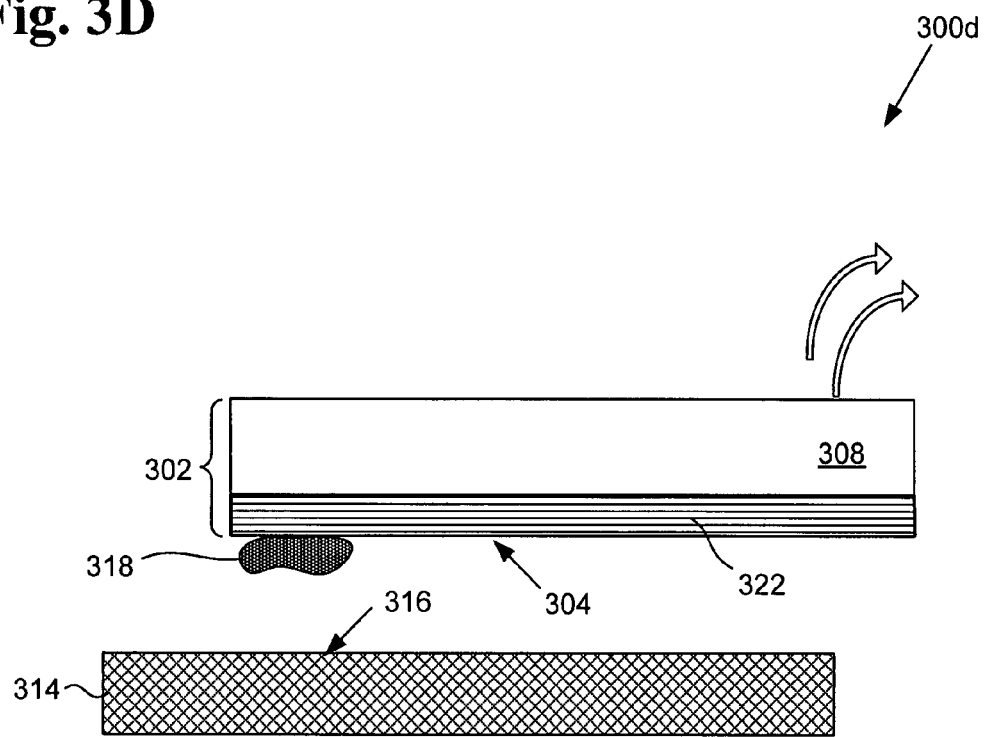

FIG. 3C and following FIG. 3D show how the present embodiment can be implemented to remove an undesirable particle from a semiconductor processing tool. As in FIG. 2C, in FIG. 3C, cleaning substrate 302 is loaded onto chuck 314 bearing undesirable particle 318. As a result, cleaning substrate 302, comprising electret layer 322 and structural layer 308, causes undesirable particle 318 to be attracted to bottom surface 304 of cleaning substrate 302. When cleaning substrate 302 is unloaded from chuck 314 in a subsequent step, shown in FIG. 3D, the attraction between electret layer 322 and undesirable particle 318 causes undesirable particle 318 to attach to bottom surface 304 and be removed from top surface 316 of chuck 314.

Figure 4A:
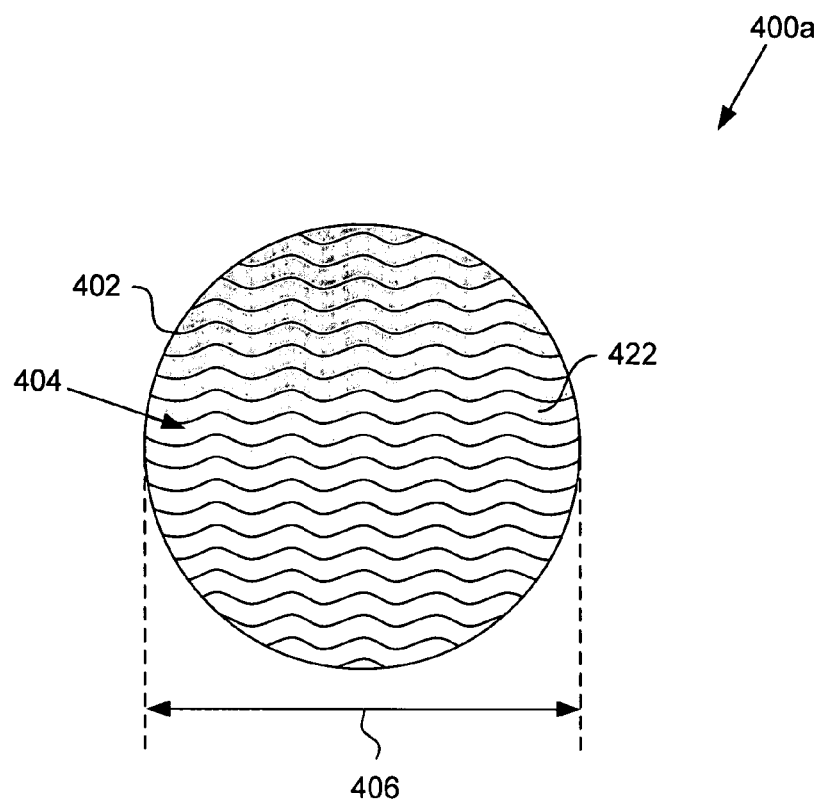
FIGS. 4A and 4B show bottom and cross-sectional views of an exemplary structure, according to another embodiment of the present invention.
Figure 4B:
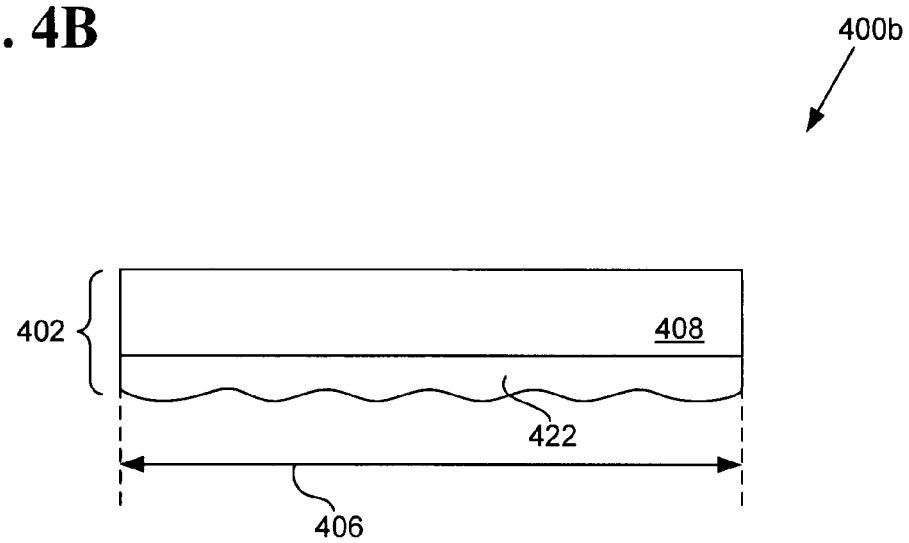

Moving on to FIGS. 4A and 4B, whereas heretofore the embodiments of the present invention's method have included cleaning substrates comprising an electret, other embodiments may utilize cleaning substrates comprising other substances, and may eschew use of an electret entirely. FIGS. 4A and 4B show a cleaning substrate that does not include an electret, according to one embodiment of the present invention. Structure 400a of FIG. 4A shows a bottom view of cleaning substrate 402 comprising adhesive layer 422, having bottom surface 404 and diameter 406, according to one embodiment of the present invention, and corresponding respectively to cleaning substrate 302 comprising electret layer 322, having bottom surface 304 and diameter 306, in the embodiment of FIG. 3A.

FIG. 4B shows structure 400b, which presents a cross-sectional view of cleaning substrate 402 comprising adhesive layer 422 and structural layer 408, with diameter 406, corresponding respectively to cleaning substrate 302 comprising electret layer 322 and structural layer 308, and diameter 306 in FIG. 3B. As in FIG. 3B, in which structural layer 308 appears over electret layer 322, FIG. 4B shows structural layer 408 situated above adhesive layer 422.

Figure 4C:
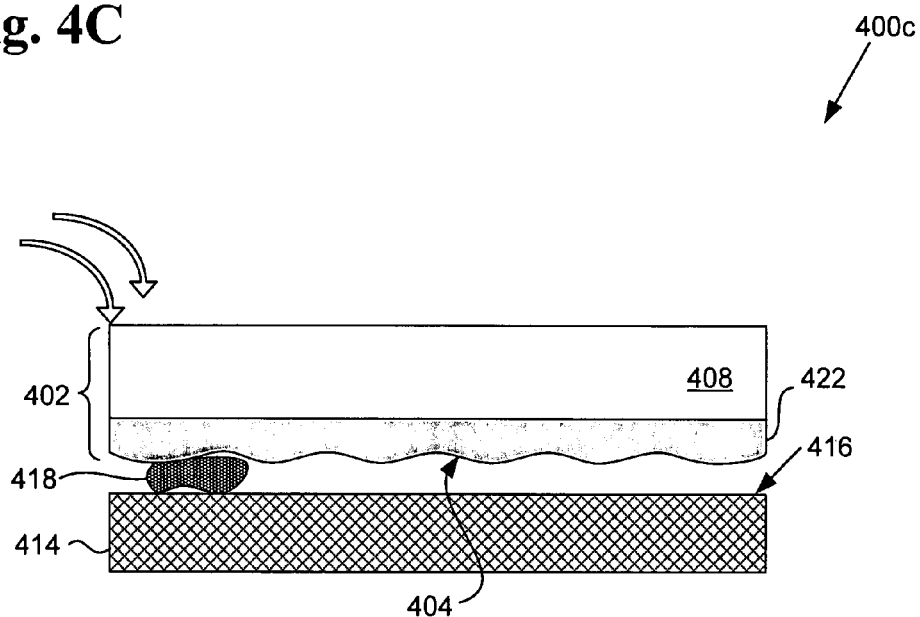
FIGS. 4C and 4D show exemplary structures corresponding to initial and intermediate steps in the flowchart of FIG. 5, according to an embodiment of the present invention.
Figure 4D:
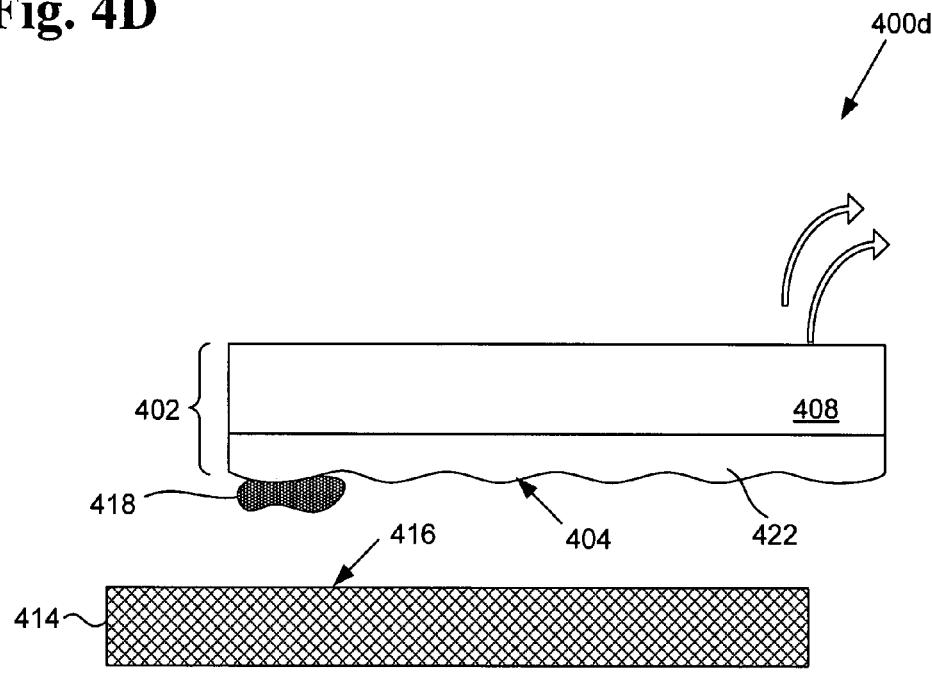

As can be seen in FIGS. 4C and 4D, implementation of the present embodiment utilizing adhesive layer 422 in place of electret layer 322 achieves a similar cleaning result. As in FIG. 3C, in FIG. 4C, cleaning substrate 402 is loaded onto chuck 414 bearing undesirable particle 418. Presence there of cleaning substrate 402, comprising adhesive layer 422 and structural layer 408, causes undesirable particle 418 to be attracted to bottom surface 404 of cleaning substrate 402. The primary difference from previous embodiments being that in FIGS. 4C and 4D, cleaning substrate 402 causes undesirable particle 418 to be attracted adhesively, while in previous examples attraction was caused by electrical field interaction. As before, when cleaning substrate 402 is unloaded from chuck 414 in a subsequent step, shown in FIG. 4D, the attraction between adhesive layer 422 and undesirable particle 418 causes undesirable particle 418 to attach to bottom surface 404 and be removed from top surface 416 of chuck 414.

Figure 5:
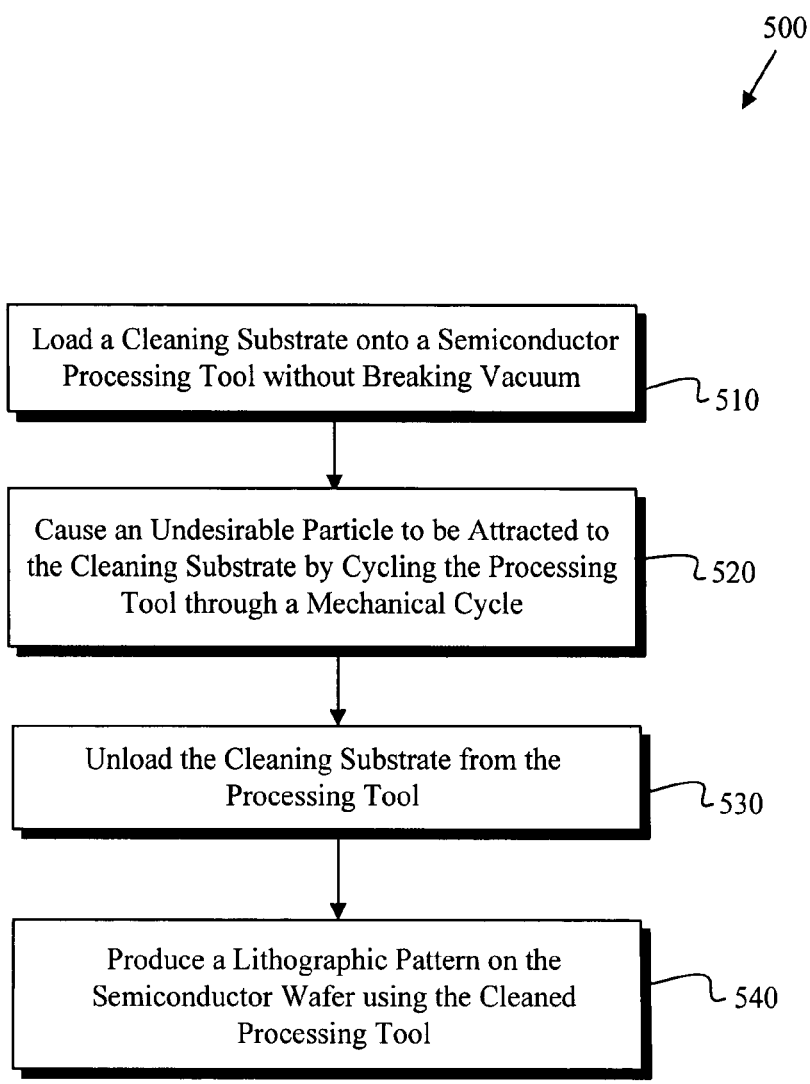
FIG. 5 shows a flowchart of an exemplary method to implement an embodiment of the present invention.

Turning now to FIG. 5, FIG. 5 shows a flowchart illustrating an exemplary method according to one embodiment of the present invention. Certain details and features have been left out of flowchart 500 that are apparent to a person of ordinary skill in the art. For example, a step may comprise one or more substeps or may involve specialized equipment or materials, as known in the art. While steps 510 through 540 indicated in flowchart 500 are sufficient to describe one embodiment of the present invention, other embodiments of the invention may utilize steps different from those shown in flowchart 500.

At step 510 in FIG. 5 and exemplary structure 200c in FIG. 2C, cleaning substrate 202 is loaded onto a semiconductor processing tool without breaking vacuum. In other embodiments, a semiconductor processing tool may not require a vacuum, in which case cleaning substrate may be loaded while the processing tool is at normal operational conditions for that processing step.

At step 520 in FIG. 5, cleaning substrate 202 is cycled through a mechanical cycle of the processing tool, causing undesirable particles it encounters to be attracted to it, as explained previously. In subsequent step 530, cleaning substrate 202 is unloaded from the processing tool, carrying away undesirable particles as described in conjunction with FIGS. 2C and 2D.

Continuing with step 540 in flowchart 500 of FIG. 5, the processing tool cleaned by cleaning substrate 202 is utilized in conjunction with a fabrication element, for example, a semiconductor wafer or lithographic mask, to produce a pattern on a semiconductor wafer. A lithographic pattern can be produced using the method described in the present application in, for example, a high resolution EUV or electron beam lithographic process.

As a result of the present invention's method for semiconductor wafer fabrication utilizing a cleaning substrate, described in the exemplary embodiments set forth in the present application and shown by flowchart 500 in FIG. 5, a semiconductor wafer having one or more semiconductor dies is fabricated. In a subsequent step (not shown on flowchart 500) the semiconductor dies can be separated from the semiconductor wafer in a dicing process after semiconductor wafer fabrication has been completed. The fabricated and separated semiconductor die, which is fabricated by using the present invention's method for semiconductor wafer fabrication utilizing a cleaning substrate, can be utilized on a circuit board, for example. The diced and separate dies can be packaged, i.e. can be enclosed and/or sealed in suitable semiconductor packages, as known in the art.

Figure 6:
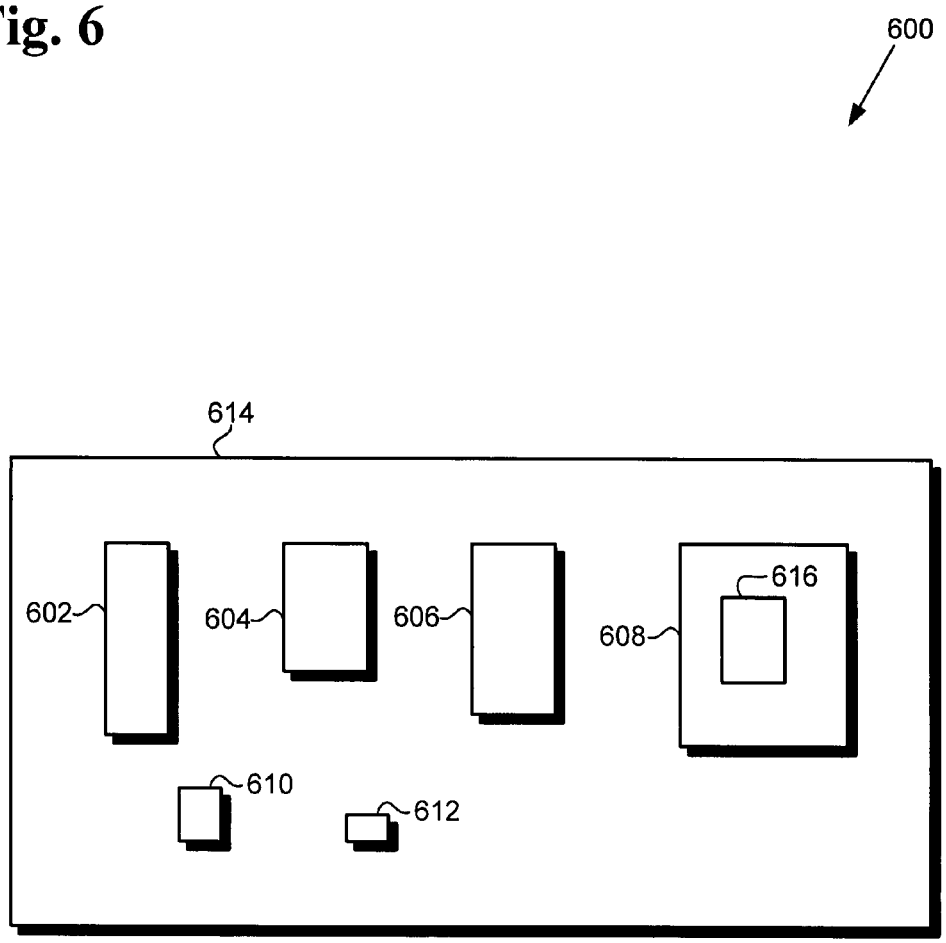
FIG. 6 is a diagram of an exemplary electronic system including an exemplary chip or die fabricated using a method for semiconductor wafer fabrication utilizing a cleaning substrate, in accordance with one or more embodiments of the present invention.

FIG. 6 is a diagram of an exemplary electronic system including an exemplary chip or die fabricated by using the present invention's method for semiconductor wafer fabrication utilizing a cleaning substrate, in accordance with one or more embodiments of the present invention. Electronic system 600 includes exemplary modules 602, 604, and 606, IC chip 608, discrete components 610 and 612, residing in and interconnected through circuit board 614. In one embodiment, electronic system 600 may include more than one circuit board. IC chip 608 can comprise a semiconductor die, which is fabricated by using an embodiment of the invention's method for semiconductor wafer fabrication utilizing a cleaning substrate. IC chip 608 includes circuit 616, which can be a microprocessor, for example.

As shown in FIG. 6, modules 602, 604, and 606 are mounted on circuit board 614 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 614 can include a number of interconnect traces (not shown in FIG. 6) for interconnecting modules 602, 604, and 606, discrete components 610 and 612, and IC chip 608.

Also shown in FIG. 6, IC chip 608 is mounted on circuit board 614 and can comprise, for example, any semiconductor die that is fabricated by utilizing an embodiment of the invention's method for semiconductor wafer fabrication utilizing a cleaning substrate. In one embodiment, IC chip 608 may not be mounted on circuit board 614, and may be interconnected with other modules on different circuit boards. Further shown in FIG. 6, discrete components 610 and 612 are mounted on circuit board 614 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 600 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, a method for semiconductor wafer fabrication utilizing a cleaning substrate advantageously improves the efficiency and cost effectiveness of semiconductor wafer fabrication. By utilizing a cleaning substrate to clean a semiconductor processing tool while preserving the operational status of the processing tool's immediate environment, the present method permits automated, regular, and frequent cleaning, without the costs and downtime associated with conventional manual techniques performed under ambient conditions. As a result, cleaning of high resolution semiconductor processing tools, such as EUV exposure tools, can be performed routinely, without breaking vacuum. Consequently, the present invention makes it possible to maintain the debris free environments necessary for high resolution lithography without incurring the costs or lost efficiency associated with conventional methods for removing debris.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for semiconductor wafer fabrication utilizing a cleaning substrate has been described.

The invention claimed is:

1. A method for fabricating a semiconductor wafer in a semiconductor processing tool, said method comprising:
    loading a cleaning substrate capable of removing an undesirable particle from said semiconductor processing tool;
    causing said undesirable particle to be attracted to said cleaning substrate;
    unloading said cleaning substrate from said semiconductor processing tool;
    loading another cleaning substrate having an opposite polarity as said cleaning substrate to attract another particle having a charge opposite said particle, said loading said another cleaning substrate implemented in tandem with said unloading said cleaning substrate;
    wherein said loading and unloading of said cleaning substrate remove said undesirable particle through a mechanical cycle by physical transfer only without operation of plasmas, emission of lithographic radiation or use of solvents, and is performed without substantially altering an operational state of said semiconductor processing tool, and wherein a bottom surface of said cleaning substrate possesses a quasi-permanent electric field thereon and induces an electric dipole moment in said undesirable particle to attract said undesirable particle to said bottom surface of said cleaning substrate without using an externally applied electric field.

2. The method of claim 1 wherein said cleaning substrate comprises an electret.

3. The method of claim 1 wherein said loading comprises placing said cleaning substrate on a chuck situated in said semiconductor processing tool.

4. The method of claim 3 wherein said cleaning substrate has a diameter less than or equal to approximately three-hundred millimeters.

5. The method of claim 1, further comprising dicing said semiconductor wafer into a plurality of semiconductor dies.

6. The method of claim 5, further comprising utilizing one or more of said plurality of semiconductor dies in a circuit board.

7. The method of claim 5, wherein one or more of said plurality of semiconductor dies are utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

8. A method for fabricating a semiconductor wafer in a semiconductor processing tool, said method comprising:

loading an electret cleaning substrate capable of removing an undesirable particle from said semiconductor processing tool without breaking vacuum;

causing said undesirable particle to be attracted to said electret cleaning substrate;

unloading said electret cleaning substrate from said semiconductor processing tool;

loading another cleaning substrate having an opposite polarity as said cleaning substrate to attract another particle having a charge opposite said particle, said loading said another cleaning substrate implemented in tandem with said unloading said cleaning substrate;

wherein said loading and unloading of said cleaning substrate remove said undesirable particle through a mechanical cycle by physical transfer only without operation of plasmas, emission of lithographic radiation or use of solvents, and is performed without substantially altering an operational state of said semiconductor processing tool, and wherein a bottom surface of said cleaning substrate possesses a quasi-permanent electric field thereon and induces an electric dipole moment in said undesirable particle to attract said undesirable particle to said bottom surface of said cleaning substrate without using an externally applied electric field.

9. The method of claim 8 wherein said loading comprises placing said electret cleaning substrate on a chuck situated in said semiconductor processing tool.

10. The method of claim 8 wherein said electret cleaning substrate has a diameter less than or equal to approximately three-hundred millimeters.

11. The method of claim 8, further comprising dicing said semiconductor wafer into a plurality of semiconductor dies.

12. The method of claim 11, further comprising utilizing one or more of said plurality of semiconductor dies in a circuit board.

13. The method of claim 11, wherein one or more of said plurality of semiconductor dies are utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

* * * * *